US009459537B2

(12) United States Patent
Cao et al.

(10) Patent No.: US 9,459,537 B2
(45) Date of Patent: Oct. 4, 2016

(54) SYSTEM AND METHOD TO ENSURE SOURCE AND IMAGE STABILITY

(75) Inventors: Yu Cao, Saratoga, CA (US); Jun Ye, Palo Alto, CA (US); Venugopal Vellanki, San Jose, CA (US); Johannes Catharinus Hubertus Mulkens, Valkenswaard (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1031 days.

(21) Appl. No.: 13/530,065

(22) Filed: Jun. 21, 2012

(65) Prior Publication Data

US 2012/0327383 A1 Dec. 27, 2012

Related U.S. Application Data

(60) Provisional application No. 61/500,114, filed on Jun. 22, 2011.

(51) Int. Cl.
*G03B 27/68* (2006.01)
*G03F 7/20* (2006.01)

(52) U.S. Cl.
CPC ........... *G03F 7/70133* (2013.01); *G03F 7/705* (2013.01); *G03F 7/70525* (2013.01); *G03F 7/70616* (2013.01)

(58) Field of Classification Search
CPC .............. G03F 7/70133; G03F 7/705; G03F 7/70525; G03F 7/70616
USPC .......................................... 355/67
See application file for complete search history.

(56) References Cited

U.S. PATENT DOCUMENTS

| 7,580,113 B2 | 8/2009 | Tel et al. |
| 7,695,876 B2 | 4/2010 | Ye et al. |
| 7,826,044 B2 | 11/2010 | Shiode |
| 2004/0156030 A1 | 8/2004 | Hansen |
| 2005/0097500 A1* | 5/2005 | Ye ........................... G03F 7/705 716/52 |

(Continued)

FOREIGN PATENT DOCUMENTS

| CN | 1625796 | 6/2005 |
| CN | 102043344 | 5/2011 |

(Continued)

OTHER PUBLICATIONS

Jun Ye et al., U.S. Appl. No. 13/481,564, filed May 25, 2012.

(Continued)

*Primary Examiner* — Deoram Persaud
(74) *Attorney, Agent, or Firm* — Pillsbury Winthrop Shaw Pittman LLP

(57) ABSTRACT

The present invention discloses various system and process embodiments where wafer-metrology and direct measurements of the lithography apparatus characteristics are combined to achieve temporal drift reduction in a lithography apparatus/process using a simulation model. The simulation model may have sub-components. For example, a sub-model may represent a first set of optical conditions, and another sub-model may represent a second set of optical conditions. The first set of optical conditions may be a standard set of illumination conditions, and the second set may be a custom set of illumination conditions. Using the inter-relationship of the sub-models, stability control under custom illumination condition can be achieved faster without wafer metrology.

25 Claims, 15 Drawing Sheets

(56) References Cited

U.S. PATENT DOCUMENTS

| | | |
|---|---|---|
| 2005/0196681 A1 | 9/2005 | Croffie et al. |
| 2005/0273753 A1* | 12/2005 | Sezginer ............. G03F 7/70425 716/52 |
| 2006/0126046 A1* | 6/2006 | Hansen ................... G03F 7/705 355/55 |
| 2007/0050749 A1* | 3/2007 | Ye .............................. G03F 1/14 430/30 |
| 2007/0296938 A1 | 12/2007 | Tel et al. |
| 2008/0158529 A1* | 7/2008 | Hansen ........................... 355/53 |
| 2008/0170774 A1* | 7/2008 | Xiong ............. G01N 21/95607 382/144 |
| 2009/0053628 A1* | 2/2009 | Ye ....................... G03F 7/70125 430/30 |
| 2009/0070083 A1* | 3/2009 | Zhang ................... G03F 1/144 703/4 |
| 2009/0097094 A1* | 4/2009 | Tanaka .......................... 359/239 |
| 2009/0276751 A1* | 11/2009 | Cao ............................ G03F 1/14 716/55 |
| 2009/0296055 A1* | 12/2009 | Ye ....................... G03F 7/70266 355/30 |
| 2009/0300573 A1* | 12/2009 | Cao .................... G03F 7/70091 716/50 |
| 2010/0058280 A1* | 3/2010 | Fan .......................... G03F 1/36 716/55 |
| 2010/0146475 A1 | 6/2010 | Cao et al. |
| 2011/0116064 A1 | 5/2011 | Ahn et al. |
| 2011/0205513 A1* | 8/2011 | Padiy ................. G03F 7/70516 355/67 |
| 2011/0222739 A1 | 9/2011 | Zhou et al. |
| 2012/0117521 A1* | 5/2012 | Feng ....................... G03F 1/144 716/54 |
| 2012/0124529 A1 | 5/2012 | Feng et al. |
| 2012/0303151 A1* | 11/2012 | Ye .......................... G05B 13/04 700/119 |

FOREIGN PATENT DOCUMENTS

| | | |
|---|---|---|
| JP | 2-828226 | 11/1998 |
| JP | 2004-079585 | 3/2004 |
| JP | 2004-342633 | 12/2004 |
| JP | 2006-173305 | 6/2006 |
| JP | 2008-166482 | 7/2008 |
| JP | 2009-194041 | 8/2009 |
| JP | 2010-251495 | 11/2010 |
| WO | 02/25711 | 3/2002 |
| WO | 2006/035925 | 4/2006 |
| WO | 2011/102109 | 8/2011 |

OTHER PUBLICATIONS

Adrianus Franciscus Petrus Engelen et al., U.S. Appl. No. 13/416,387, filed Mar. 9, 2012.

Max Born et al., "Principles of Optics—Electromagnetic theory of propagation, interference and diffraction of light," Cambridge University Press, Seventh Edition, Section 10.6.3, pp. 598-607 (1999).

Donis G. Flagello et al., "Theory of high-NA imaging in homogeneous thin films," J. Opt. Soc. Am. A, vol. 13, No. 1, pp. 53-64 (Jan. 1996).

* cited by examiner

SYSTEM AND METHOD TO ENSURE SOURCE AND IMAGE STABILITY

CROSS-REFERENCE TO RELATED APPLICATIONS

This application claims priority to U.S. Provisional Application No. 61/500,114 filed Jun. 22, 2011, the contents of which is incorporated herein by reference in its entirety.

FIELD OF INVENTION

The technical field of the present invention relates generally to lithography processes and apparatuses, and more specifically to performance stability control of lithography apparatuses and processes

BACKGROUND

Lithographic apparatuses can be used, for example, in the manufacture of integrated circuits (ICs). In such a case, the mask may contain a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "lens"; however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer (via the mask).

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as 'Moore's law'. At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process in which features with dimensions smaller than the classical resolution limit of an optical projection system are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of the projection optics, CD is the 'critical dimension'—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as 'resolution enhancement techniques' (RET).

As one important example of RET, optical proximity correction (OPC), addresses the fact that the final size and placement of a printed feature on the wafer will not simply be a function of the size and placement of the corresponding feature on the mask. It is noted that the terms 'mask' and 'reticle' are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. In a typical high-end design almost every feature edge requires some modification in order to achieve printed patterns that come sufficiently close to the target design. These modifications may include shifting or biasing of edge positions or line widths as well as application of 'assist' features that are not intended to print themselves, but will affect the properties of an associated primary feature.

While OPC has been integral to the computational lithography field, wafer metrology based process control has been used in the fab product field. To optimize overall development cycle times and manufacturing solutions, computational lithographers and fab product manufacturers have been working synergistically to optimize target designs, lithography processes and lithography apparatus parameters. Historically, chipmakers have optimized the various manufacturing steps independent of one another. However, migrating to 32-nm technology node and smaller, independent optimization is no longer enough. A holistic lithography approach that intelligently integrates computational lithography, wafer metrology based lithography, and process control is required. To that end, a comprehensive lithography simulation model is needed, where the model characterizes the imaging performance on arbitrary patterns and therefore facilitates in achieving stable imaging performance by a lithography apparatus (also referred to as a 'scanner'). Current lithography simulation models make use of both scanner module data and process response data such as critical dimension (CD) measurements on wafer. Similarly, matching and stability control of imaging performance can be based on individual scanner modules (illumination, projection optics, etc.), CD measurements on wafer, or both. One of the primary purposes of the model is to predict various lithography process parameter differences, such as, CD differences, behavior difference between two different scanners, behavior difference between two different conditions on the same scanner, behavior difference between two different time instances on the same scanner etc., for the same/different pattern on the mask. "Differential accuracy" is requirement for the models, such that the CD differences predicted by the model match CD differences measured on wafer within a certain accuracy tolerance. With this premise, scanner matching and stability control become model-based or model-assisted, as the models provide guidance to the scanner adjustments needed to compensate for differences between two scanners or between two time instances for the same scanner. This invention describes a method for scanner matching and stability control, whereas the model can be updated based on wafer metrology and scanner measurement so that imaging stability is achieved for standard and custom optical conditions.

SUMMARY OF THE INVENTION

The present invention discloses various system and process embodiments where wafer-metrology and direct measurements of the lithography apparatus characteristics are combined to achieve temporal drift reduction in a lithography apparatus/process using a simulation model. The simulation model may have sub-components. For example, a sub-model may represent a first set of optical conditions, and another sub-model may represent a second set of optical conditions. The first set of optical conditions may be a standard set of conditions, and the second set may be a custom set of conditions, or vice versa, i.e. the first set can be a custom set, and the second set can be a standard set. Note that a set of condition may comprise one or more conditions.

The simulation model has several parameters, including but not limited to, illumination source pupil characteristics, projection optics characteristics, reticle characteristics, wafer characteristics, as well as, lithography process response parameters (e.g., critical dimension, overlay, best focus, side wall angle etc.).

In one aspect of the present invention, a method of controlling stability in a lithography process is described, where the method comprises: (a) defining baseline performances of a lithography apparatus for use in the lithography process in a lithography model, wherein a first sub-model of the lithography model defining a first baseline performance is obtained under a first illumination condition, and a second sub-model of the lithography model defining a second baseline performance is obtained under a second illumination condition, the lithography model comprising one or more of illumination source pupil characteristics and lithography process response parameters; (b) monitoring illumination stability of the lithography apparatus under the first illumination condition by measuring a first temporal drift data of the illumination source pupil characteristics and using the first measured temporal drift data to maintain the illumination source pupil characteristics within or substantially close to the first baseline performance; and, (c) monitoring lithography process response stability under the second illumination condition by measuring a second temporal drift data of the lithography process response parameter and using the second measured temporal drift data to maintain the lithography process response within or substantially close to the second baseline performance.

In another aspect of the invention, a method of reducing temporal drift of lithography process parameters to maintain performance stability in a lithography process is disclosed. The method comprises: (a) defining baseline performances for the lithography process in a lithography model, wherein a first sub-model of the lithography model defining a first baseline performance is obtained under a first optical condition, and a second sub-model of the lithography model defining a second baseline performance is obtained under a second optical condition; (b) measuring a first temporal drift data of a first lithography process parameter with respect to the first baseline performance under the first optical condition; (c) measuring a second temporal drift data of a second lithography process parameter with respect to the second baseline performance under the second optical condition; and, (d) using inter-relationship of the first and the second sub-models, and the measured first and the second temporal drift data to determine required adjustments in the first and the second lithography process parameters to maintain the lithography process within or substantially close to the defined baseline performances. The inter-relationship of the first and the second sub-models comprises a mathematical function (may be termed as a cost function) that relates a lithography process response change with a change in the optical condition in both the first and the second sub-models.

These and other aspects of the invention, including a scanner matching/tuning aspect of the invention will be clear to persons skilled in the art based on the following drawings and detailed description.

BRIEF DESCRIPTION OF THE DRAWINGS

The specific embodiments of the invention are described in conjunction with the accompanying figures, wherein.

DETAILED DESCRIPTION OF THE EXAMPLE EMBODIMENTS

Figure 1:
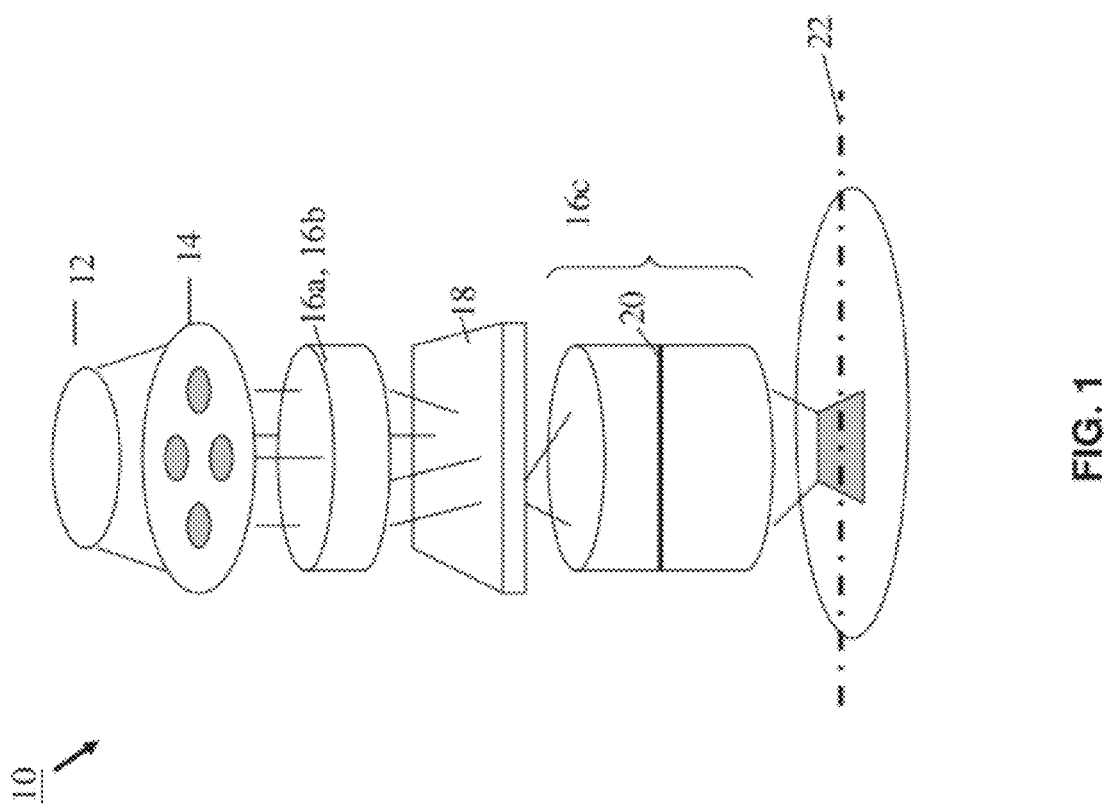
FIG. 1 is a block diagram of various subsystems of a lithography system according to example implementations of the present invention.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general, the semiconductor industry is driven by "shrink"—the ability to make chip features smaller, that often leads to increased device performance and decreased manufacturing cost. However, as chip features get smaller, so do the tolerances or "process window" that manufacturers must work within. The smaller the process window the harder it is to manufacture chips that work properly. Smaller process window typically imposes extremely tight requirements on parameters such as overlay and critical dimension uniformity (CDU).

To address the chip manufacturability need through lithography, an increased ability to control a lithography apparatus is imperative. Note that though there are different types of lithography apparatuses, including but not limited to a scanning lithography apparatus, the term "scanner" has been used frequently in this application to denote any lithography apparatus that is used to perform a lithography process. Moreover, the lithography apparatus may not be a physical apparatus, but a simulated model of a physical apparatus.

Scanner stability control systems and methods give manufacturers greater control over their scanner's focus and overlay (i.e., layer-to-layer alignment) uniformity. This leads to an optimized and stabilized process window for a given feature size and chip application, enabling the continuation of shrink and the creation of more advanced chips. Note that the scanner stability control method works in conjunction with other controlling factors, such as, programmable illumination pupil control, projection optics (lens) control, etc.

When a lithography system is first installed/used, it is calibrated to ensure optimal operation. However, over time, system performance parameters will drift. A small amount of drift may be tolerated, but drift beyond a certain threshold may run the risk of the lithography process and/or apparatus going out of specification. So manufacturers may periodically need to stop production for re-calibration. Calibrating the system more frequently gives a bigger process window, but that usually means more scheduled downtime.

The scanner stability control options greatly reduce these production stoppages. Instead of stoppage, scanner stability control system automatically resets the lithography apparatus/process to a pre-defined reference performance (often referred to as 'baseline') periodically. The period of reset may be controlled by the users. Examples are, resetting every day, resetting after an arbitrary number hours of operation, resetting after a certain number of process runs, etc. To do the reset, the scanner stability control system retrieves standard measurements taken on a wafer using a metrology tool. The wafer may be a test wafer or monitor wafer. The monitor wafer is exposed using a special test reticle containing special scatterometry marks. However, persons skilled in the art will recognize that scatterometry marks can be accommodated in an actual target wafer also, such as along scribelines, in between two chips, in the peripheral areas of a wafer, etc. Additionally, wafer measurement technique is not limited to scatterometry. It may involve conventional measurements with scanning electron microscope (SEM). The scanner stability control method of the present application is not limited by the particular method of wafer metrology.

From wafer metrology, the scanner stability control system determines how far the system has drifted from its baseline. It then calculates, for example, wafer-level overlay and focus correction data. The lithography apparatus then converts these correction data sets into specific corrections for each exposure on subsequent wafers, including production wafers.

Some of the key features and benefits of the scanner stability control include, but are not limited to:

Long-term focus stability, at various process conditions, without sacrificing scanner productivity Long-term matched machine overlay stability, at various process conditions, without sacrificing scanner productivity Ability to monitor scanner overlay and focus Efficient integration into a fully automated/semi-automated step.

A. General Environment in a Lithography System for Implementing Example Embodiments of the Present Invention Prior to discussing the present invention, a brief discussion regarding the overall simulation and imaging process is provided. FIG. 1 illustrates an exemplary lithographic projection system 10. The major components are a light source 12, which may be, for example, a deep-ultraviolet excimer laser source, or a source of other wavelengths, including EUV wavelength, illumination optics, which define the partial coherence, and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA=\sin(\Theta_{max})$.

Figure 2:
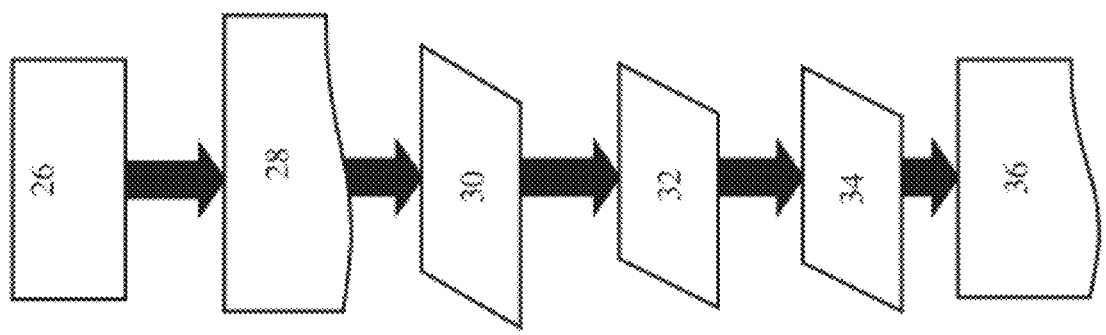
FIG. 2 is a block diagram of simulation models corresponding to the subsystems in FIG. 1.

In a lithography simulation system, these major system components can be described by separate functional modules, for example, as illustrated in FIG. 2. Referring to FIG. 2, the functional modules include the design layout module 26, which defines the target design layout; the mask layout module 28, which defines the mask to be utilized in imaging process; the mask model module 30, which defines the model of the mask layout to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model 32 that includes, but not limited to, NA-sigma ($\sigma$) settings as well as any particular illumination source shape, where $\sigma$ (or sigma) is outer radial extent of the illuminator. The optical properties of the photo-resist layer coated on a substrate—i.e. refractive index, film thickness, propagation and polarization effects—may also be captured as part of the optical model 32. The mask model 30 captures the design features of the reticle and may also include a representation of detailed physical properties of the mask. Finally, the resist model 34 describes the effects of chemical processes which occur during resist exposure, PEB and development, in order to predict, for example, contours of resist features formed on the substrate wafer. The objective of the simulation is to accurately predict, for example, edge placements and CDs, which can then be compared against the target design. The target design, is generally defined as the pre-OPC mask layout, and will be provided in a standardized digital file format such as GDSII or OASIS. Those skilled in the art will understand that the input file format is irrelevant.

B. Example Methods of the Present Invention

Figure 3:
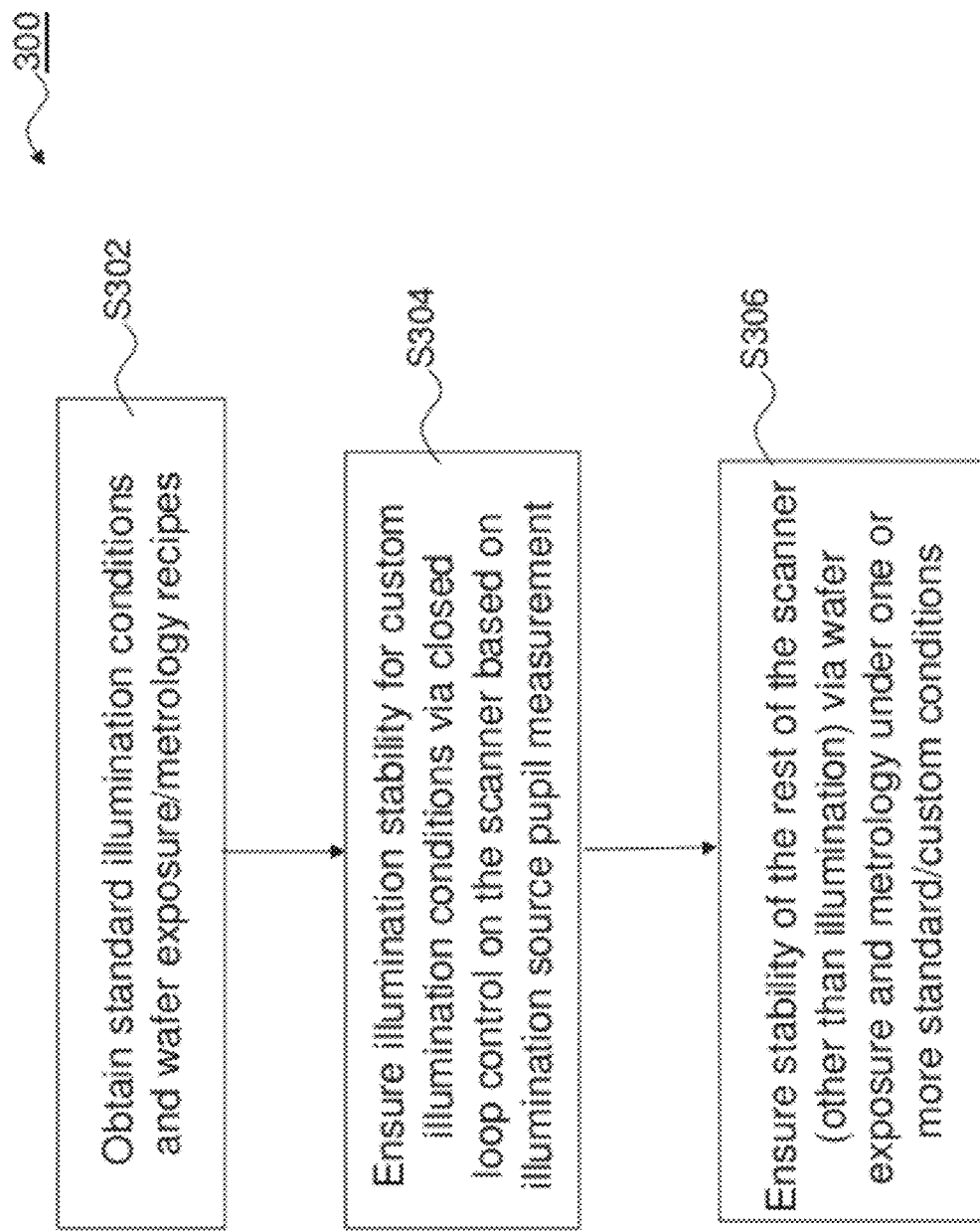
FIG. 3 is a flowchart describing an example of the scanner stability control concept, according to an embodiment of the present invention.

FIG. 3 shows an example process flow according to an embodiment of the present invention. Typically, lithographers associate a major portion of the image stability issues with illumination control. Also, measurement capability of illumination pupil is relatively mature using specialized tools. From product fabrication efficiency point of view, running a process under one or more known illuminations settings of interest ("standard illumination") is advantageous. This would simplify the setup and monitoring logistics, by reducing the sets of test patterns, types of resist processes, and conditions to measure. This may also help in making sure the patterns print robustly and reliably, and have predictable/controllable robust metrology recipes ready. Step S302 of flowchart 300 depicts this operation.

In the present application, methods to achieve imaging stability for arbitrary "custom illumination" conditions are discussed, by ensuring illumination source stability for the custom condition via closed-loop control on the scanner based on illumination source pupil measurements. Step S304 of flowchart 300 shows this operation.

Additionally, stability for the rest of scanner (other than illumination source) is ensured via wafer exposure and metrology under one or more standard/custom conditions. This operation is shown in step S306 of flowchart 300.

Note that, steps S304 and S306 may take place serially or in parallel in different embodiments. Also, intermediate steps may be included in flowchart 300.

Also, both steps S304 and S306 may be performed during a setup stage, where a scanner is being calibrated or tuned or checked for accuracy before the actual chip fabrication, or during a monitoring operation that runs while actual chip fabrication. In a broad sense, the "set-up" phase is described as "t=0" phase, and a controlling/monitoring phase is described as "t>0" phase, though persons skilled in the art will appreciate that both t=0 and t>0 signify not just one instant of time, but a combination of several instants of time (and/or timeframes) required to complete the sub-steps of a desired operation, as will be elaborated with FIGS. 4-8. In general, FIGS. 4-5 pertain to the conditions at "t=0" and FIGS. 6-8 pertain to the conditions at "t>0."

Moreover, persons skilled in the art will appreciate that the terminologies "standard" and "custom" are not restrictive. A "standard" condition may include a first (or a second) set of one or more optical conditions, and a "custom" condition may include a second (or a first) set of one or more optical conditions. Broadly speaking, the terms "first" and "second" in the specification and in the claims do not indicate any chronological sequence or any particular condition, but merely indicate two entities. Optical conditions may include illumination source conditions, projection optics conditions, wafer conditions, reticle conditions (including design layouts), or any other lithography process conditions that can be tuned by a user, and/or can drift or change on their own. By having access to a library of "standard" condition recipes, a large part of the calibration/monitoring method of a lithography apparatus/process can be accomplished quickly and reliably. Further calibration/monitoring can be done by using one or more "custom" conditions. "Custom" conditions may be specified by end users. A non-limiting illustrative example of "custom" condition may be a specific polarization of the illumination source at a specific location of the source pupil that optimally prints a critical feature on a custom design layout.

Subsequent to a calibration/monitoring process under standard conditions, a faster process control may be done with computational methods, with or without wafer metrology under the custom conditions.

From a theoretical point of view, a lithography system can be separated into the illumination sub-system and a mathematical transfer function (expressed as a set of point-spread functions, or point-source TCCs) representing a system response under coherent illumination. Once the stability of both the illumination sub-system and the coherent transfer function are ensured, a stable imaging performance is automatically achieved.

For the simplified case of scalar imaging, the lithography system can be fully characterized by the illumination source pupil and the projection optics pupil that contributes to the coherent transfer function. If both the illumination source pupil and the projection optics pupil are made stable, then the overall imaging is stable. In one embodiment, the illumination source pupil is kept stable via source pupil measurements and feedback control, and the projection optics pupil is kept stable via wafer metrology under standard condition. The projection optics pupil may stay the same when the illumination conditions are changed to arbitrary illumination conditions.

For vector imaging (which is needed for high NA cases), the projection optics pupil may be replaced by a set of pupil filters, one for each polarization component. This set of pupil filters can also be termed a "point-source TCC". The number of significant eigenvectors, or effective rank of this point-source TCC matrix, may depend on a variety of incoherent factors that may include, but are not limited to, focus blur caused by chromatic aberration or other types of aberrations, illumination source laser bandwidth, stage vibration etc, and x/y blur caused by stage vibrations. Again, the imaging performance is ensured to be stable as long as the illumination pupil and the point-source TCC are stable. Projection optics knobs may be used to ensure the stability of a coherent transfer function or a point-source TCC.

Mathematically, the point-source TCC determines the image intensity under a point source illumination of unit intensity, for a given mask pattern. The total image intensity under a non-point source is then equal to the sum of contributions from all source points, each weighted by the source intensity at that point. In other words, the contribution from each point source is determined by the convolution of a test pattern (on the mask design layout), and the point source TCC (which is similar to a point spread function or PSF), and the weight is determined by the illumination pupil characteristics. This is the so-called "Abbe imaging formulation". This affirms that the total image intensity is stable (and therefore CDs and overlays are stable), as long as both the source and the point-source TCC are stable. Further details can be found in the textbook "Principle of Optics," by Max Born and Emil Wolf, seventh edition, Cambridge University Press, 1999, and also in the article titled, "Theory of high-NA imaging in homogeneous thin films," by Flagello et al, Journal of Optical Society of America, vol. 13, no. 1, January 1996, pp. 53-64.

As will be elaborated further, a key idea of the present invention is to establish a baseline performance model for a lithography apparatus or lithography process, and matching a current performance to the baseline performance using the model. The baseline model is developed based on experience and/or based on initial set-up/calibration. The baseline performance model may also be referred to as a 'pilot model,' 'reference model,' 'baseline model,' or 'baseline reference model.' In certain embodiments, the baseline performance model is used as a 'sensitivity model,' where the CD (or other metric) sensitivity of arbitrary test patterns to variations of one or more process parameters can be calculated from the model.

Stability of the performance of the lithography apparatus or the lithography process is monitored by analyzing temporal drift of certain performance metrics over a certain predefined period and/or at a preset interval with respect to the baseline performance. In other words, the baseline performance serves as a guide to measure how much the performance has deviated with time. One or more settings of the lithography apparatus are adjusted using the baseline model, to compensate for the temporal drift, so that the performance is brought back substantially close to the desired baseline performance. Persons skilled in the art will understand that there may be parameters of a lithography apparatus or process (or a simulated model thereof) which can not be physically adjusted as a 'setting' (i.e. a condition that can be set by a tunable knob). 'Settings' of a lithography apparatus may be a subset of a bigger set of lithography parameters. In a physical scanner, some examples of controllable or tunable settings are: intensity distribution knobs of an illumination source (by programmable mirrors or other means), polarization control knobs of an illumination source, aberration control knobs in lens pupil plane or other planes along the projection optics system, numerical aperture control knobs, etc. Other examples of adjustable settings may include: wavelength spectrum of an illumination source, tilt of a reticle, tilt of a wafer, etc. Note that, the invention is not limited to compensating drifts of physical scanner-effects by adjusting the settings of an apparatus. Some example non-scanner effects, such as, resist process drifts, can also be compensated by tuning the settings of an apparatus. Example parameters relevant for resist process drift monitoring may: resist image parameters, resist diffusion, quencher concentration etc. For example, the resist diffusion effect causes degradation in image contrast and dose latitude, and is largely degenerate with stage vibration. It is conceivable that certain optical settings can be adjusted to partially compensate for the image contrast loss, for example, NA, or stage vibration. Resist image parameters may include critical dimension uniformity (CDU), edge placement error (EPE), overlay error, sidewall angle (SWA), and best focus offset. Additional details for baseline model-based computational process control (CPC) can be found in the co-owned U.S. non-provisional application Ser. No. 13/481,564, filed May 25, 2012, titled, "Computational Process Control."

In this application, the baseline model may comprise a plurality of sub-models. For example, a first baseline sub-model may be defined corresponding to a first optical condition (e.g., one or more standard/custom conditions), and a second baseline sub-model may be defined corresponding to a second optical condition (e.g., one or more custom/standard conditions).

Figure 4:
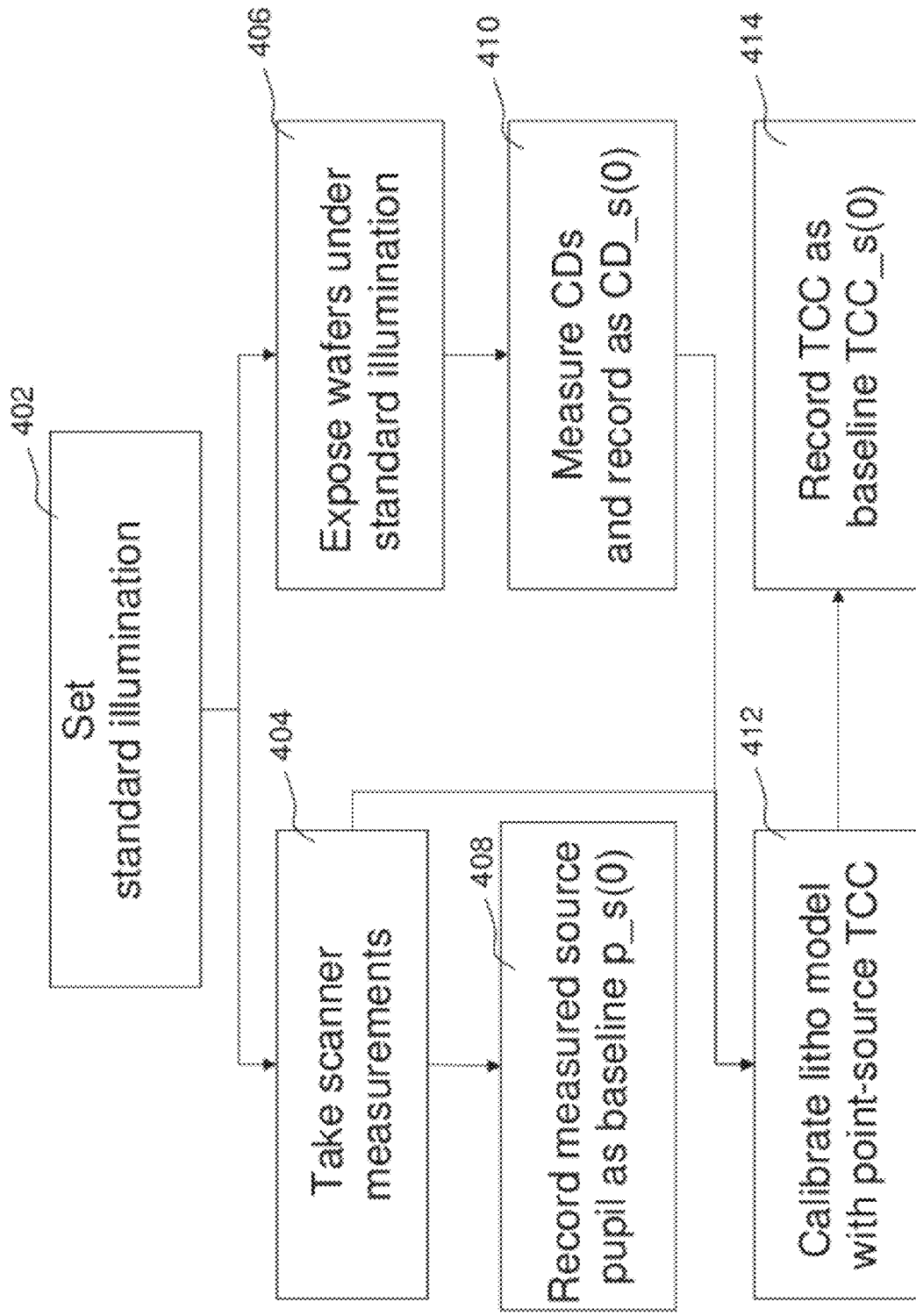
FIGS. 4-8 depict illustrative process flows for scanner stability set-up and control, according to example embodiments of the present invention.
Figure 5:
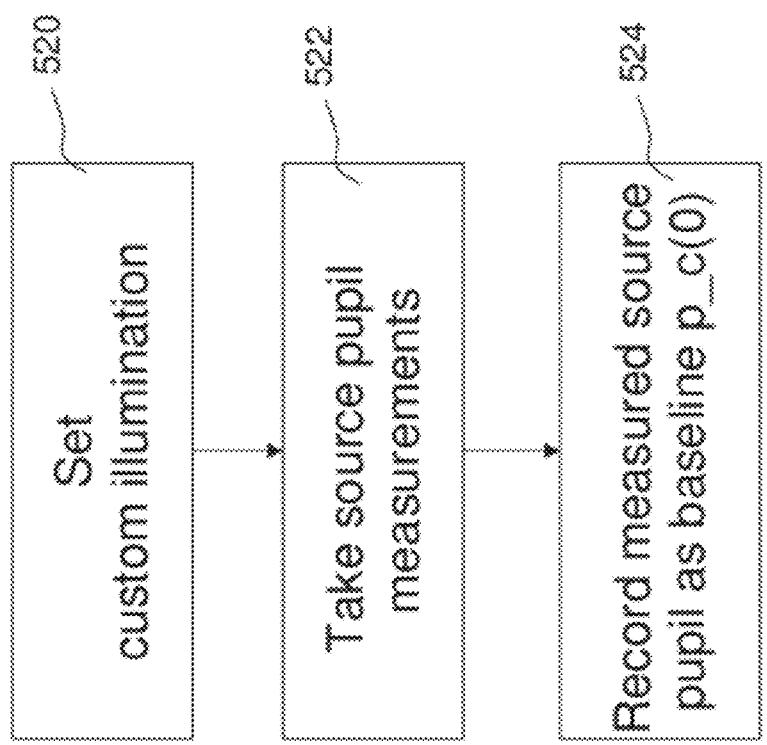

FIGS. 4-5 show flowcharts for initial set-up (i.e. at the t=0 phase, as defined before) for a lithography apparatus to generate and/or calibrate a baseline performance model.

In FIG. 4, set-up under standard illumination condition is described. In step 402, a standard illumination condition is set in a scanner. In step 404, one or more measurements are taken, including source pupil measurements. In step 408, measured source pupil is recorded as the baseline source pupil characteristics ($p\_s(0)$ at t=0) under the standard condition. Note that for a plurality of standard conditions, corresponding $p\_s(0)$ values may be measured, or an effective p_s(0) value may be derived using weighted average or other standard mathematical methods.

In step 406, a wafer (typically a test wafer) is exposed under the standard illumination condition. In step 410, CDs are measured, and recorded as the baseline CD under standard illumination at t=0 (CD_s(0)). Note that though CD is denoted as the metric to be measured, it can be other metrics also, such as EPE, sidewall angle (SWA), best focus etc.

In step 412, the measurements from steps 404 and 410 are used to generate/calibrate a baseline sub-model for standard illumination condition. As described before, the calibration is done with point source TCC, and the rank of the TCC matrix may be determined by various coherent/incoherent factors.

In step 414, the calibrated TCC is recorded as the baseline TCC under standard illumination at t=0 (TCC_s(0)).

In FIG. 5, set-up under custom illumination condition is described. Note, this process can be done without wafer metrology.

In step 520, a custom illumination condition is set in a scanner. In step 522, source pupil measurements are taken. In step 524, measured source pupil is recorded as the baseline source pupil characteristics (p_c(0) at t=0) under the custom condition. Note that for a plurality of custom conditions, corresponding p_c(0) values may be measured, or an effective p_c(0) value may be derived using weighted average or other standard mathematical methods. Measurements from step 522 are used to generate/calibrate a baseline sub-model for custom illumination condition.

Figure 6:
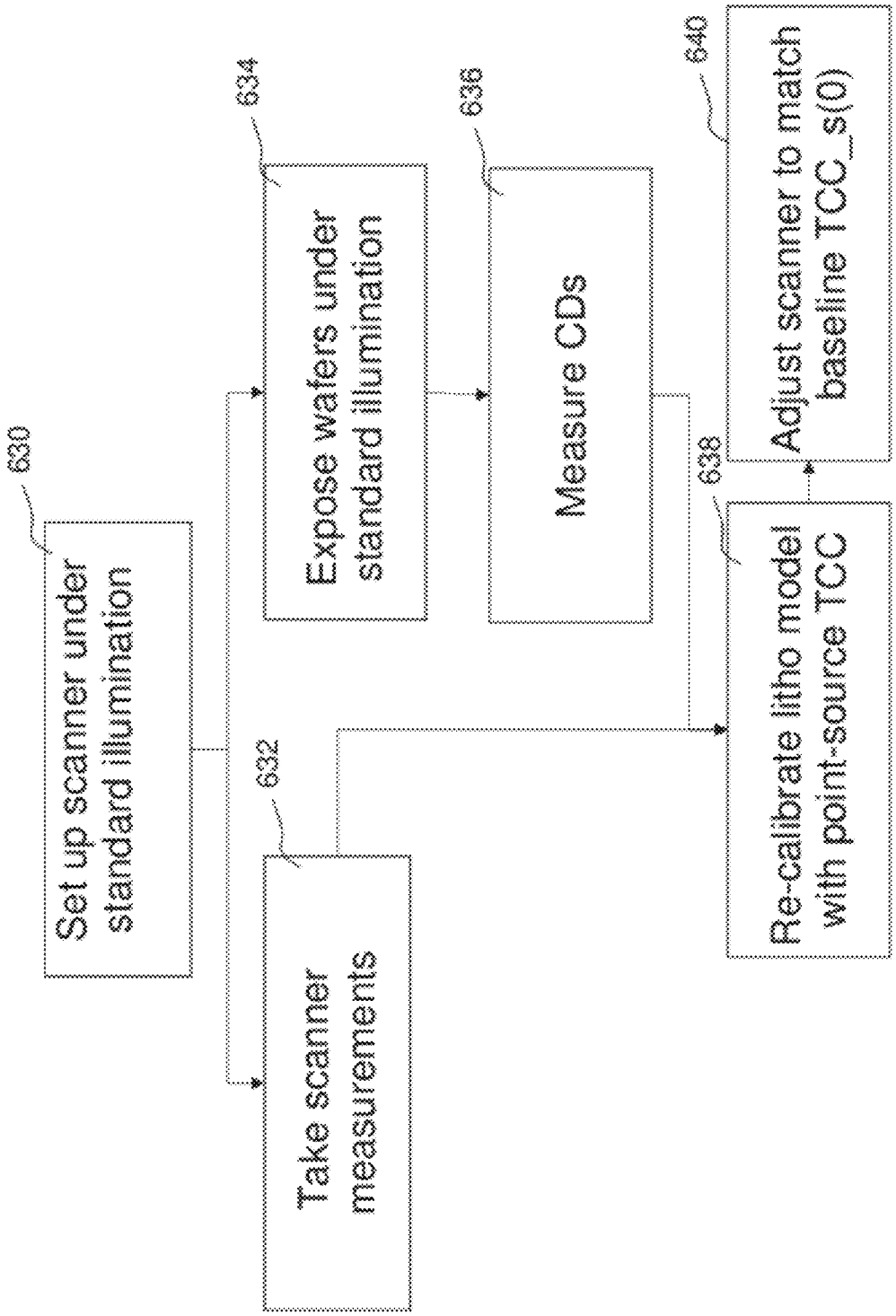
Figure 7:
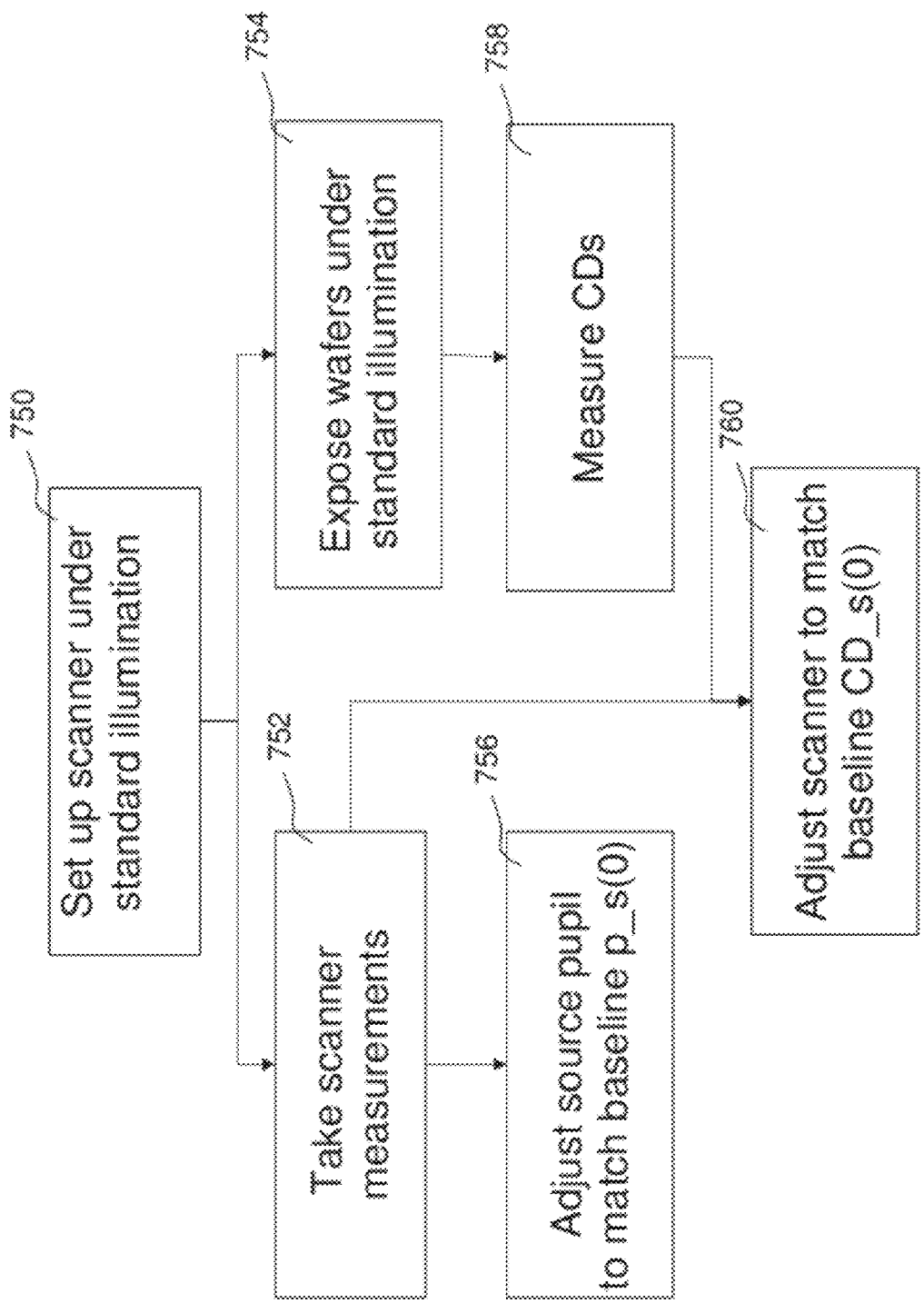
Figure 8:
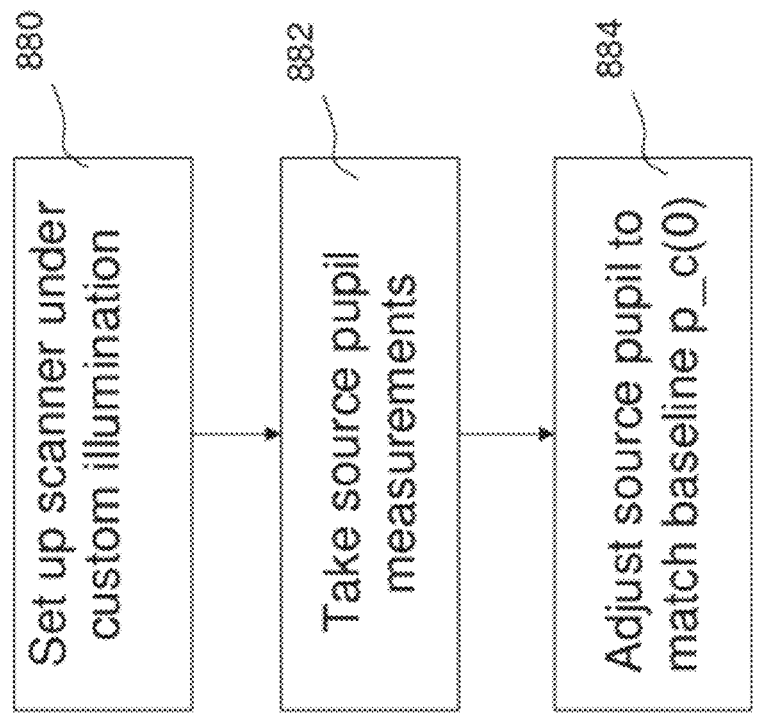

FIGS. 6-8 show flowcharts for the control/monitoring phase (i.e. at the t>0 phase, as defined before) for a lithography apparatus to reduce/compensate process drift using the baseline performance model (i.e. the standard and custom baseline sub-models).

In FIG. 6, in step 630, the scanner is set up under a standard illumination condition. In step 632, one or more measurements are taken, including source pupil measurements to see if the source pupil characteristics have drifted with respect to the measurements at t=0. In step 634, a wafer (a test wafer or an actual wafer) is exposed under the standard illumination condition. In step 636, CDs (or other metrics) are measured to detect temporal drift with respect to the measurements at t=0. In step 638, the baseline sub-model under the standard illumination condition is recalibrated with point source TCC using measurements from steps 632 and 636. In step 640, scanner knobs (including but not limited to illumination knobs and projection optics knobs) are adjusted to match the TCC at t>0 to TCC_s(0). This way, the temporal drift of TCC is reduced/compensated and the stability of the scanner is restored to the desired effect. In other words, the scanner setting adjustments are done together during step 640 with the goal of restoring baseline performance by reducing TCC drift.

In an alternative process flow for control/monitoring at t>0, shown in FIG. 7, the scanner setting adjustments can be done is a plurality of steps with the goal of restoring baseline performance by reducing source pupil drift and CD (or other lithography process response metric) drift. In FIG. 7, in step 750, the scanner is set up under a standard illumination condition. In step 752, one or more measurements are taken, including source pupil measurements to see if the source pupil characteristics have drifted with respect to the measurements at t=0. In an additional adjustment step 756, illumination source pupil is adjusted to match baseline p_s(0). In step 754, a wafer (a test wafer or an actual wafer) is exposed under the standard illumination condition. In step 758, CDs (or other metrics) are measured to detect temporal drift with respect to the measurements at t=0. In step 760, scanner knobs (including but not limited to illumination knobs and projection optics knobs) are adjusted to match the CD (or other metric) at t>0 to CD_s(0).

FIG. 8 shows that scanner stability control can be achieved without wafer measurement under custom illumination to expedite the overall calibration/stability control process. Because of the wafer-metrology based stability control process performed on the scanner under standard illumination condition, and because of the inherent interrelationship between the two components of the baseline model (i.e. standard illumination sub-model and custom illumination sub-model), a reduced set of scanner knobs may have to be adjusted to reduce temporal drift to match a desired baseline performance. For example, adjusting settings of the illumination source pupil to restore the baseline performance under the custom illumination condition also restores baseline critical dimension due to the inherent inter-relationship between the illumination source pupil characteristics and the critical dimension. The inter-relationship of the first and the second sub-models exists because a common mathematical function (which can be termed as a cost function) relates a lithography a process response (e.g., a CD) change with a change in the optical condition (e.g., change in illumination setting) in both the first and the second baseline sub-models.

In FIG. 8. in step 880, a custom illumination condition is set-up in the scanner. In step 882, source pupil measurements are taken. In step 884, the source pupil is adjusted to match baseline source pupil characteristics (p_c(0) at t=0) under the custom condition.

It is to be noted that though in many of the example embodiments, only a source illumination optimization is discussed, the scope of the invention is not limited to illumination settings only. For example, projection optics settings (such as, numerical aperture, aberration etc.), reticle settings (such as, reticle tilt), and wafer settings (such as, reticle tilt) may also be adjusted based on direct measurement of the scanner sub-systems, and/or combining that with wafer metrology data. The underlying assumption would be that any apparatus setting that can be measured accurately without wafer metrology can be used to substitute or complement illumination source pupil measurement. The additional assumption is that the apparatus setting of interest (illumination setting and/or other settings) can be controlled to be stable by itself, i.e. stable for a variety of optical conditions, standard and/or custom.

FIGS. 9-13 depict how the above concepts discussed with reference to FIGS. 4-8 can be extended to the matching/tuning of scanners (or simulation models thereof). A benefit of having adjustable parameters (or knobs) to pre-optimize a scanner is that it enables a user to tune the behavior of a scanner in order to match the behavior of another reference scanner or a desired preset scanner behavior based on a simulation model (e.g., the behavior of a virtual scanner). In co-pending co-owned patent application, titled, "Methods and System for Model-Based Generic Matching and Tuning," US publication no. 2010/0146475 to Cao et al., behavior matching/tuning has been discussed, but the adjustment parameters ("knobs") were mainly linear parameters, such as illumination source intensity parameters. In a subsequent co-pending co-owned patent application, titled, "Pattern-Independent and Hybrid Matching/Tuning Including Light Manipulation by Projection Optics," U.S. non-provisional application Ser. No. 13/293,118 to Feng et al., filed Nov. 9, 2011, the concept of matching/tuning is extended to include non-linear scanner effects also, some of which may result from projection optics characteristics. Some illumination source characteristics, design layout/reticle characteristics also may result in non-linear scanner effects.

Behavior matching can be useful for correcting behavior differences between two scanners due to variations of manufacturing these apparatuses, or correcting deviation of behaviors of one scanner over time due to factors such as temperatures, wear, aging, chemical and physical properties of resist, mask, etc. In the simulation domain, the behavior of the reference scanner may be available a priori as a simulated reference model, i.e. the simulated reference model represents the behavior of a virtual scanner. When comparing behavior with a physical scanner, the same type of scanner (i.e. same model of scanner) or a different type of scanner (i.e. a different model of scanner) may be used as the reference. When a virtual scanner's behavior is used as simulated reference model, the simulated reference model may be based on a customized behavior that an end-user wants, or an 'ideal' or desired behavior that produces a predefined process window or produces favorable lithographic responses. For example, a particular behavior of an apparatus may be modeled as a relationship between a design layout to an image or a resist image on a reference substrate generated by projecting the design layout onto the substrate using the scanner. The resist image can be represented by, for example, various characteristics of the resist image (e.g., resist contours, CD, edge placement error). The behaviors of a scanner can be, for example, combined optical behaviors of the source and the projection optics, which is independent from the design layout. If two scanners have identical combined optical behaviors of the source and the projection optics, images projected from an identical design layout to an identical resist-coated substrate by these two scanners will be substantially identical. The combined optical behaviors of the source and the projection optics of a scanner can be represented by the transmission cross coefficient (TCC) as explained in details below. Therefore, matching behaviors of a scanner to the desired behaviors can be achieved by matching the TCC of the scanner to the TCC representing the desired behaviors. The cost function is flexible enough to be adapted to all the various possibilities of behavior matching/tuning mentioned above.

Furthermore, the behavior matching/tuning may be done in a pattern-independent manner such as the TCC matching, or in a hybrid manner in which in addition to TCC matching, the matching/tuning further comprises comparing a lithographic response using a test pattern (or multiple test patterns).

Persons skilled in the art will appreciate that though "matching" and "tuning" are used here interchangeably, typically "matching" indicates behavior matching between two physical scanners, and "tuning" indicates adjusting a simulation model of a scanner with respect to a reference simulation model. The reference simulation model may come from a physical scanner, but it does not have to. The matching/tuning can be done with process window constraints. For example, in tuning, a process can be adapted to remain within a predefined process window. However, matching/tuning can be done without process window constraint also.

Figure 9:
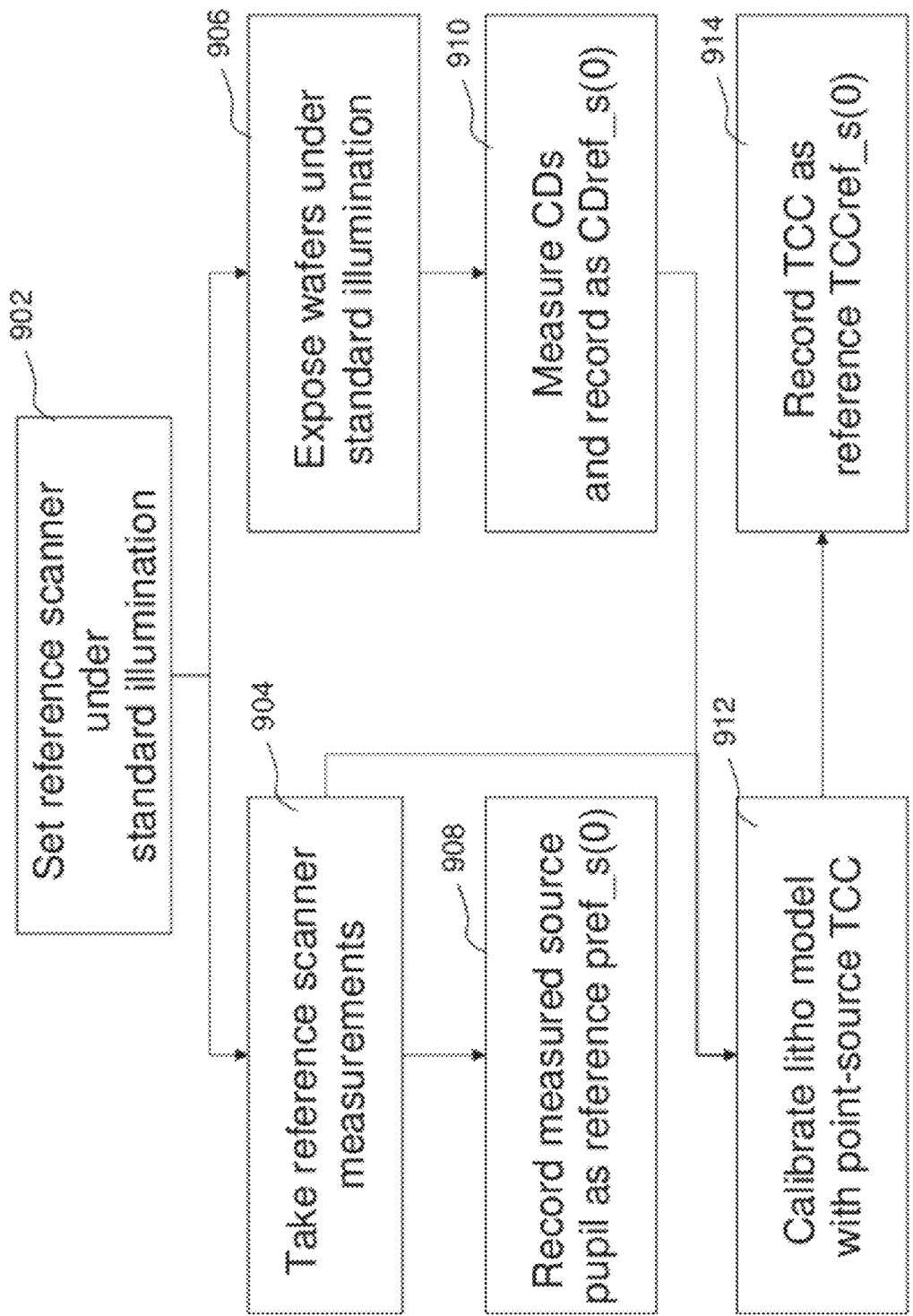
FIGS. 9-13 depict illustrative process flows for scanner matching and tuning, according to example embodiments of the present invention.
Figure 10:
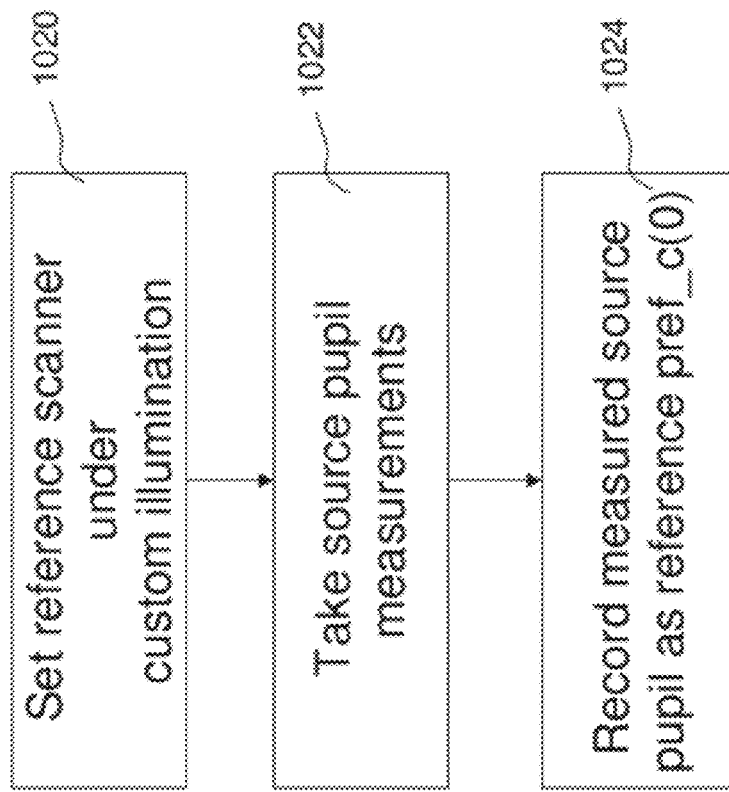

FIGS. 9-10 show flowcharts for initial set-up (i.e. at the t=0 phase) for a reference scanner to which a current scanner will be matched.

In FIG. 9, set-up under standard illumination condition is described for a matching process. In step 902, a standard illumination condition is set in a reference scanner. In step 904, one or more measurements are taken, including source pupil measurements. In step 908, measured source pupil is recorded as the reference source pupil characteristics (pref_s(0) at t=0) under the standard condition. Note that for a plurality of standard conditions, corresponding pref_s(0) values may be measured, or an effective pref_s(0) value may be derived using weighted average or other standard mathematical methods.

In step 906, a wafer (typically a test wafer) is exposed under the standard illumination condition. In step 910, CDs are measured, and recorded as the reference CD under standard illumination at t=0 (CDref_s(0)). Note that though CD is denoted as the metric to be measured, it can be other metrics also, such as EPE, sidewall angle (SWA), best focus etc.

In step 912, the measurements from steps 904 and 910 are used to generate/calibrate a reference sub-model for standard illumination condition. As described before, the calibration is done with point source TCC, and the rank of the TCC matrix may be determined by various coherent/incoherent factors.

In step 914, the calibrated TCC is recorded as the baseline TCC under standard illumination at t=0 (TCCref_s(0)).

In FIG. 10, set-up under custom illumination condition is described. Note, this process can be done without wafer metrology.

In step 1020, a custom illumination condition is set in a reference scanner. In step 1022, source pupil measurements are taken. In step 1024, measured source pupil is recorded as the reference source pupil characteristics (pref_c(0) at t=0) under the custom condition. Note that for a plurality of custom conditions, corresponding pref_c(0) values may be measured, or an effective pref_c(0) value may be derived using weighted average or other standard mathematical methods. Measurements from step 1022 are used to generate/calibrate a reference sub-model for custom illumination condition.

Figure 11:
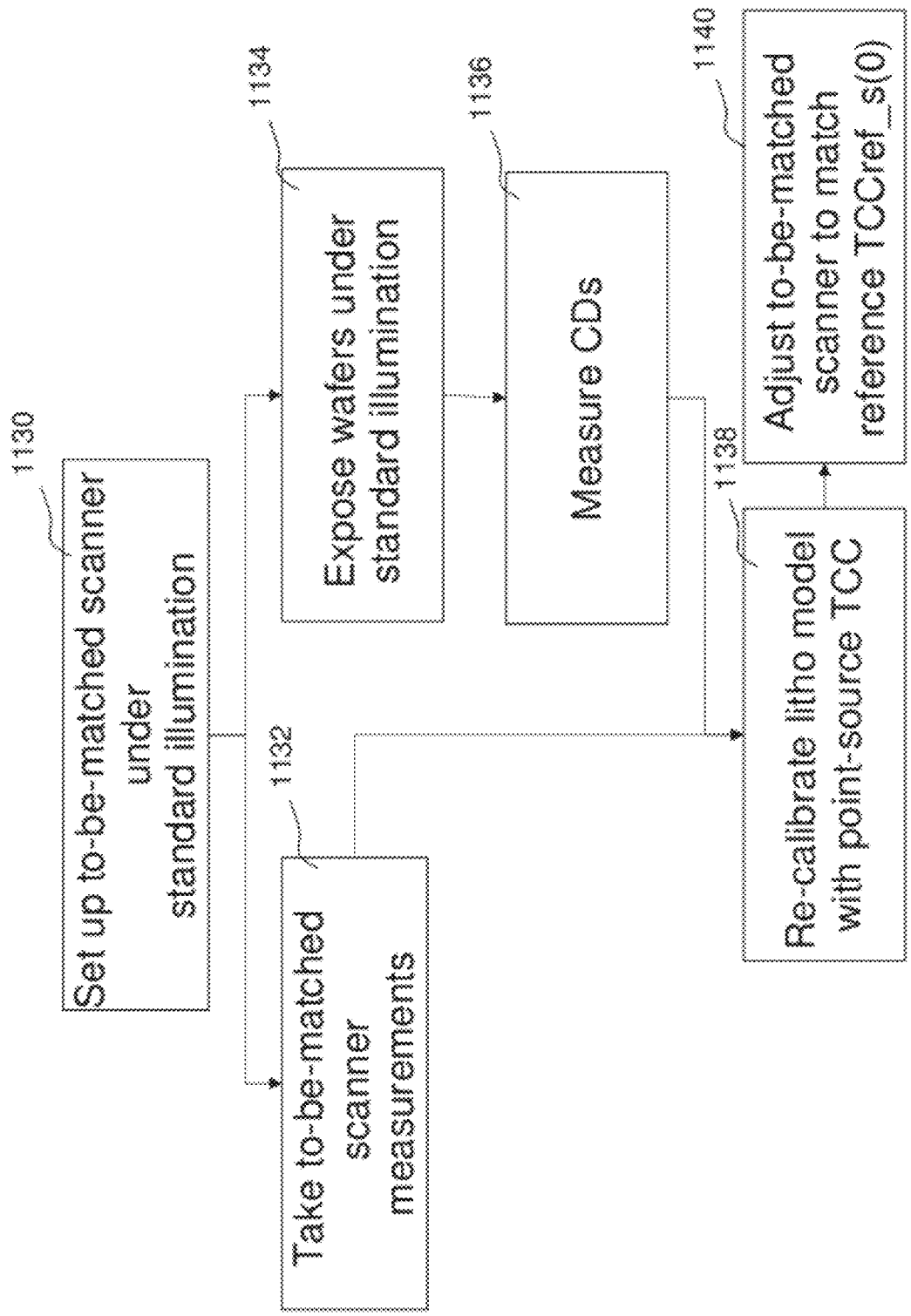
Figure 12:
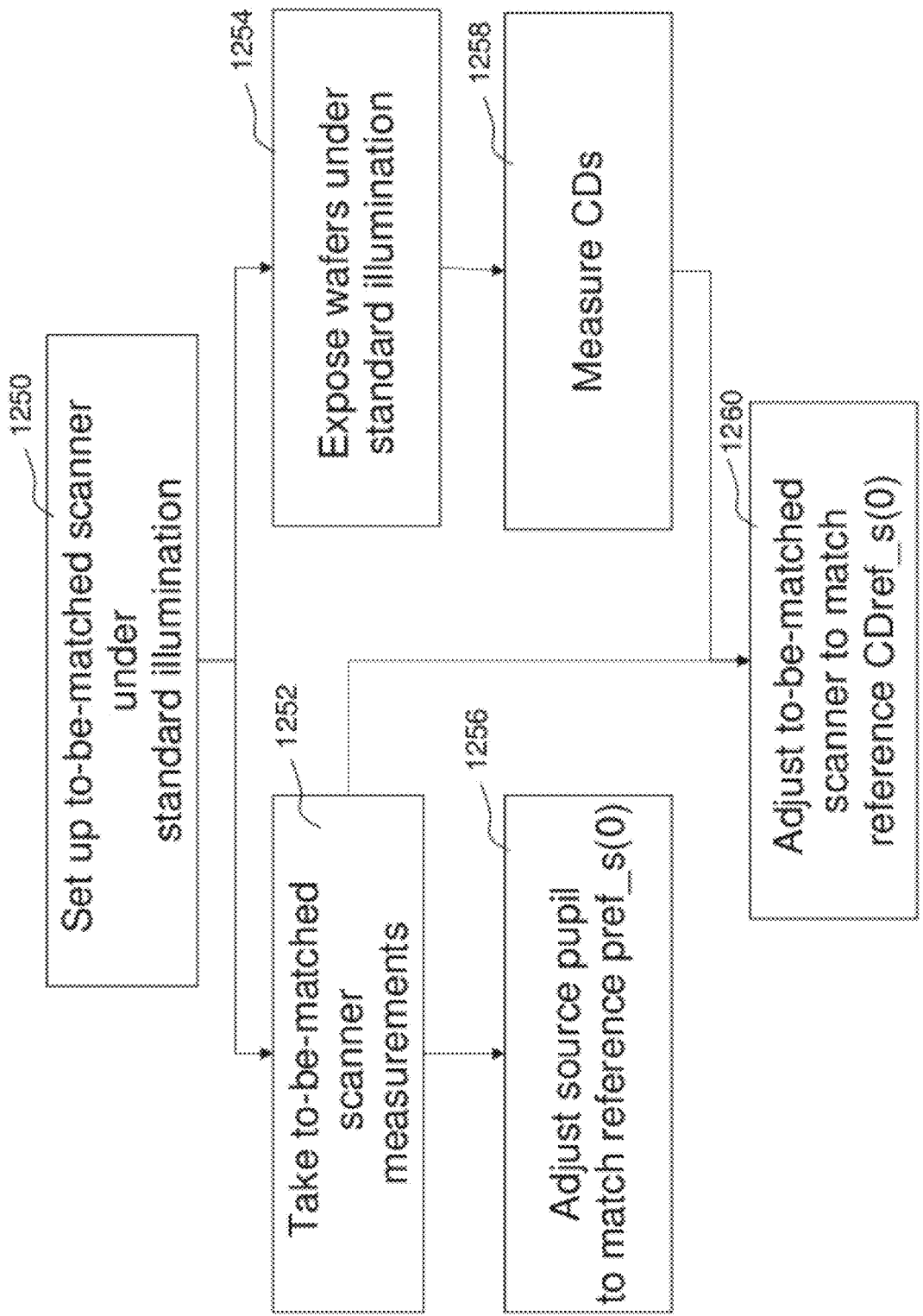
Figure 13:
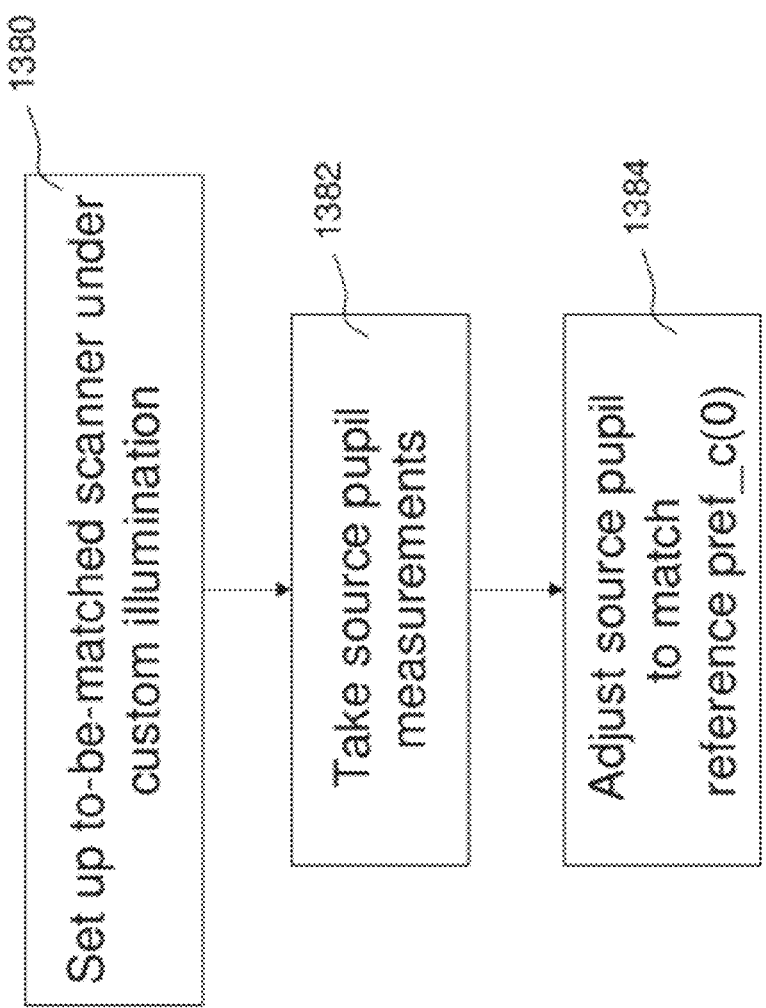

FIGS. 11-13 show flowcharts for the tuning phase (i.e. at the t>0 phase) for a lithography apparatus to reduce/compensate process drift using the reference performance model (i.e. the standard and custom reference sub-models).

In FIG. 11, in step 1130, the to-be-matched scanner is set up under a standard illumination condition. In step 1132, one or more measurements are taken, including source pupil measurements to see if the source pupil characteristics have drifted with respect to the measurements at t=0. In step 1134, a wafer (a test wafer or an actual wafer) is exposed under the standard illumination condition. In step 1136, CDs (or other metrics) are measured to detect temporal drift with respect to the measurements at t=0. In step 1138, the reference sub-model under the standard illumination condition is recalibrated with point source TCC using measurements from steps 1132 and 1136. In step 1140, to-be-matched scanner knobs (including but not limited to illumination knobs and projection optics knobs) are adjusted to match the TCC at t>0 to TCCref_s(0). This way, the temporal drift of TCC is reduced/compensated and the stability of the to-be-matched scanner is restored to the desired effect. In other words, the scanner setting adjustments are done together during step 1140 with the goal of matching the reference performance by reducing TCC drift.

In an alternative process flow for control/monitoring at t>0, shown in FIG. 12, the to-be-matched scanner setting adjustments can be done in a plurality of steps with the goal of matching with the reference performance by reducing source pupil drift and CD (or other lithography process response metric) drift. In FIG. 12, in step 1250, the to-bematched scanner is set up under a standard illumination condition. In step 1252, one or more measurements are taken, including source pupil measurements to see if the source pupil characteristics have drifted with respect to the measurements at t=0. In an additional adjustment step 1256, illumination source pupil is adjusted to match reference pref_s(0). In step 1254, a wafer (a test wafer or an actual wafer) is exposed under the standard illumination condition. In step 1258, CDs (or other metrics) are measured to detect temporal drift with respect to the measurements at t=0. In step 1260, to-be-matched scanner knobs (including but not limited to illumination knobs and projection optics knobs) are adjusted to match the CD (or other metric) at t>0 to CDref_s(0).

FIG. 13 shows that a scanner can be tuned without wafer measurement under custom illumination to expedite the overall matching/tuning process. Because of the wafer-metrology based tuning process performed on the scanner under standard illumination condition, and because of the inherent inter-relationship between the two components of the reference model (i.e. standard illumination sub-model and custom illumination sub-model), a reduced set of scanner knobs in the to-be-matched scanner may have to be adjusted to reduce temporal drift to match a desired reference performance.

In FIG. 13. in step 1380, a custom illumination condition is set-up in the to-be-matched scanner. In step 1382, source pupil measurements are taken. In step 1384, the source pupil is adjusted to match baseline source pupil characteristics (pref_c(0) at t=0) under the custom condition.

Figure 14:
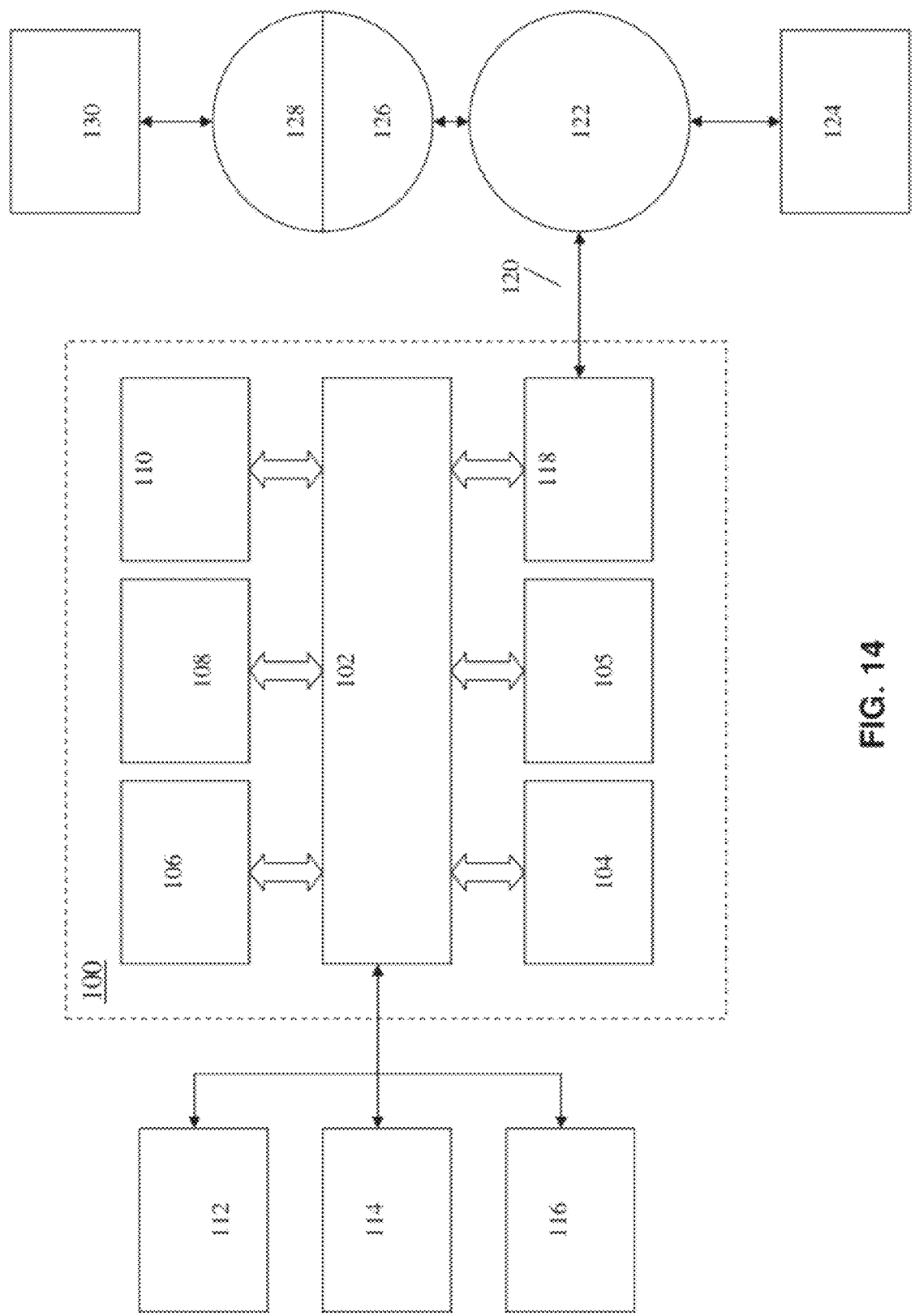
FIG. 14 is a block diagram of an example computer system in which embodiments can be implemented.

C. Details of a Computer System for Implementing the Embodiments of the Present Invention FIG. 14 is an exemplary block diagram that illustrates a computer system 100 which can assist in embodying and/or implementing the pattern selection method disclosed herein. Computer system 100 includes a bus 102 or other communication mechanism for communicating information, and one or more processor(s) 104 (and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the simulation process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the test pattern selection of the embodiment, for example. The received code may be executed by processor 104 as it is received, and/or stored in storage device 110, or other non-volatile storage for later execution. In this manner, computer system 100 may obtain application code in the form of a carrier wave.

D. Example Lithography Tool

Figure 15:
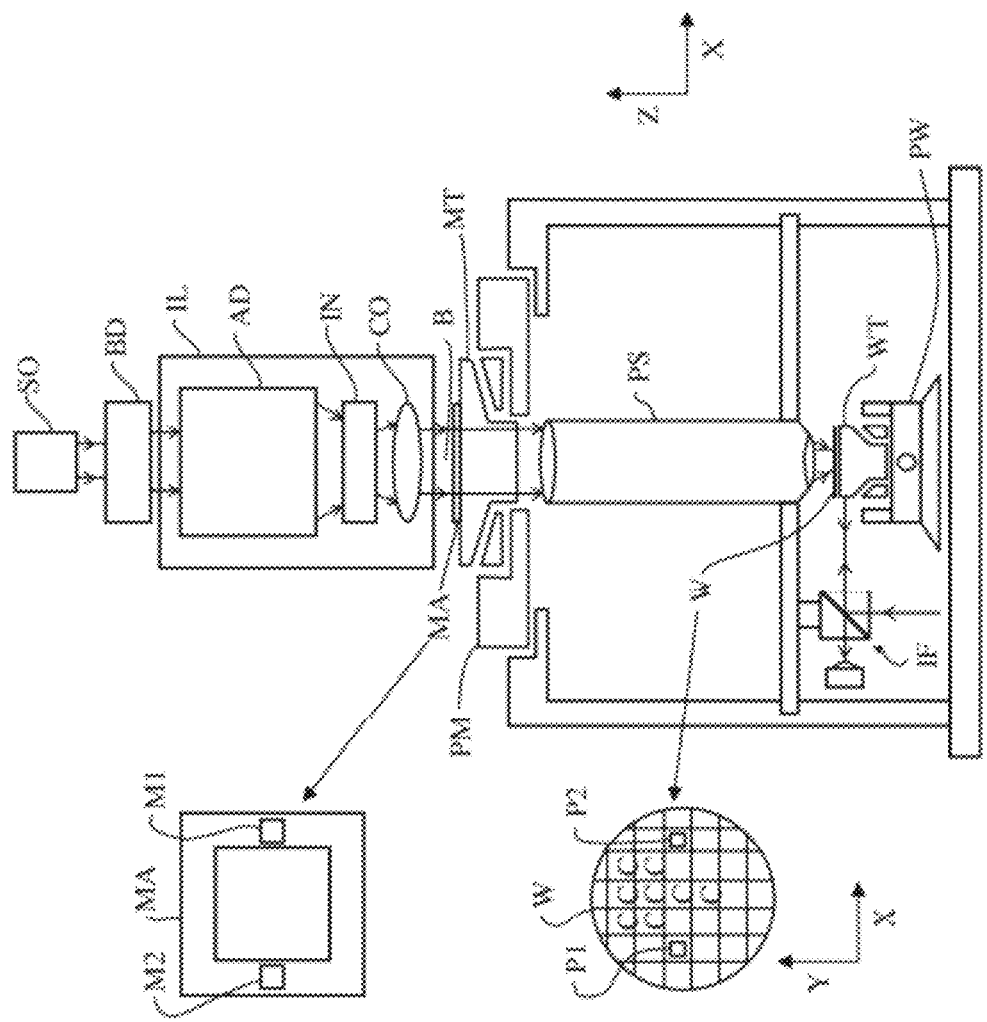
FIG. 15 is a schematic diagram of a lithographic projection apparatus to which embodiments are applicable.

FIG. 15 schematically depicts an exemplary lithographic projection apparatus whose performance could be simulated and/or optimized utilizing the computational lithography models that are calibrated using the test pattern selection process of present invention. The apparatus comprises:

- a radiation system IL, for supplying a projection beam B of radiation. In this particular case, the radiation system also comprises a radiation source SO;
- a first object table (mask table) MT provided with a mask holder for holding a mask MA (e.g., a reticle), and connected to first positioning means PM for accurately positioning the mask with respect to projection system PS;
- a second object table (substrate table) WT provided with a substrate holder for holding a substrate W (e.g., a resist-coated silicon wafer), and connected to second positioning means PW for accurately positioning the substrate with respect to projection system PS;
- a projection system ("lens") PS (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source SO (e.g., a mercury lamp or excimer laser) produces a beam of radiation. This beam is fed into an illumination system (illuminator) IL, either directly or after having traversed conditioning means, such as a beam expander or beam delivery system BD, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the mask MA has a desired uniformity and intensity distribution in its cross-section.

It should be noted with regard to FIG. 15 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing). The current invention encompasses at least both of these scenarios.

The beam B subsequently intercepts the mask MA, which is held on a mask table MT. Having traversed the mask MA, the beam B passes through the lens PS, which focuses the beam PS onto a target portion C of the substrate W. With the aid of the second positioning means (and interferometric measuring means IF), the substrate table WT can be moved accurately, e.g. so as to position different target portions C in the path of the beam B. Similarly, the first positioning means can be used to accurately position the mask MA with respect to the path of the beam B, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the mask table MT may just be connected to a short stroke actuator, or may be fixed.

Patterning device MA and substrate W may be aligned using alignment marks M1, M2 in the patterning device, and alignment marks P1, P2 on the wafer, as required.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam B;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam B is caused to scan over a mask image; concurrently, the substrate table WT is simultaneously moved in the same or opposite direction at a speed V=Mv, in which M is the magnification of the lens PS (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include DUV (deep ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The invention may further be described using the following clauses:

1. A method of reducing temporal drift of lithography process parameters to maintain performance stability in a lithography process, the method comprising:

(a) defining baseline performances for the lithography process in a lithography model, wherein a first sub-model of the lithography model defining a first baseline performance is obtained under a first optical condition, and a second sub-model of the lithography model defining a second baseline performance is obtained under a second optical condition;

(b) measuring a first temporal drift data of a first lithography process parameter with respect to the first baseline performance under the first optical condition;

(c) measuring a second temporal drift data of a second lithography process parameter with respect to the second baseline performance under the second optical condition; and (d) using inter-relationship of the first and the second sub-models, and the measured first and the second temporal drift data to determine required adjustments in the first and the second lithography process parameters to maintain the lithography process within or substantially close to the defined baseline performances, wherein the inter-relationship of the first and the second sub-models comprises a mathematical function that relates a lithography process response change with a change in the optical condition in both the first and the second sub-models.

2. The method of clause 1, wherein the first optical condition comprises one of: a standard optical condition, and a custom optical condition.

3. The method of clause 1, wherein the second optical condition comprises one of: a standard optical condition, and a custom optical condition.

4. The method of any of clauses 2 and 3, wherein the standard optical condition comprises one or more standard illumination modes, and the custom optical condition comprises one or more custom illumination modes.

5. The method of clause 1, wherein step (b) is performed using one or both of wafer metrology technique, and lithography apparatus characteristics measurement technique.

6. The method of clause 1, wherein step (c) is performed using direct measurement of lithography apparatus characteristics.

7. The method of clause 1, wherein the first and the second lithography process parameters include settings of a lithography apparatus used to perform the lithography process.

8. The method of clause 7, wherein the settings of the lithography apparatus include one or more of: illumination source characteristics, projection optics characteristics, reticle characteristics, wafer characteristics, or any combination thereof.

9. The method of clause 7, wherein the lithography process parameters include process sensitivity parameters indicative of a response of the lithography process to variations of one or more settings of the lithography apparatus.

10. The method of clause 9, wherein the process sensitivity parameters include: critical dimension (CD) error, overlay error, sidewall angle change, and best focus offset.

11. The method of clause 1, wherein the method comprises:

in step (c), measuring a temporal drift of illumination source pupil characteristics of a lithography apparatus used to perform the lithography process under a custom illumination condition; and in step (d), adjusting settings of the illumination source pupil to restore the baseline performance under the custom illumination condition, wherein a critical dimension is also restored to a baseline critical dimension due to the inter-relationship between the illumination source pupil characteristics and the critical dimension.

12. The method of clause 11, the illumination source pupil characteristics are controlled by one or more of: tuning the illumination source intensity, tuning the illumination source wavelength, controlling beam pointing, and tuning the illumination source polarization.

13. The method of clause 1, wherein projection optics characteristics are adjusted to ensure stability of a point-source transmission cross-coefficient (TCC) function that is used to define the first baseline performance of an illumination source.

14. The method of clause 1, wherein prior to step (a), a plurality of patterns are designed or obtained, wherein a first subset of the plurality of patterns corresponds to the variation of a first lithography process parameter, and a second subset of the plurality of patterns corresponds to the variation of a second lithography process parameter.

15. The method of clause 14, wherein the patterns comprise test patterns on a test reticle, test patterns on a target reticle, or target patterns on a target reticle.

16. The method of clause 15, wherein test patterns on a target reticle are located on one or more of the following locations: scribe lines, one or more edges of a design layout, and unutilized real estate on the design layout adjacent to or interspersed with target patterns.

17. The method of clause 1, wherein the lithography model for the baseline performance is derived by matching with or adapting to an existing reference model.

18. A method of controlling stability in a current lithography process by matching the current lithography process with a reference lithography process, the method comprising:

(a) defining reference performances for the reference lithography process in a lithography model, wherein a first sub-model of the lithography model defining a first reference performance is obtained under a first illumination condition, and a second sub-model of the lithography model defining a second reference performance is obtained under a second illumination condition, the lithography model comprising one or more of illumination source pupil characteristics and lithography process response parameters;

(b) monitoring illumination stability in the current lithography process under the first illumination condition by measuring a first temporal drift data of the illumination source pupil characteristics and using the first measured temporal drift data to maintain the current illumination source pupil characteristics within or substantially close to the first reference performance; and (c) monitoring lithography process response stability in the current lithography process under the second illumination condition by measuring a second temporal drift data of the lithography process response parameter and using the second measured temporal drift data to maintain the current lithography process response within or substantially close to the second reference performance.

19. The method of clause 18, wherein the first illumination condition comprises one of: a standard illumination condition, and a custom illumination condition.

20. The method of clause 18, wherein the second illumination condition comprises one of: a standard illumination condition, and a custom illumination condition.

21. The method of any of clauses 9 and 20, wherein the standard illumination condition comprises one or more standard illumination modes, and the custom illumination condition comprises one or more custom illumination modes.

22. The method of clause 18, wherein step (b) is performed using direct measurement of the illumination source pupil characteristics.

23. The method of clause 18, wherein step (c) is performed using one or both of wafer metrology technique, and lithography apparatus characteristics measurement technique.

24. The method of clause 18, wherein steps (b) and (c) include adjusting settings of a lithography apparatus used to perform the current lithography process.

25. The method of clause 24, wherein the settings of the lithography apparatus include one or more of: illumination source characteristics, projection optics characteristics, reticle characteristics, wafer characteristics, or any combination thereof.

26. The method of clause 24, wherein in step (c), the lithography process response parameter comprises a parameter indicative of a response of the lithography process to variations of one or more settings of the lithography apparatus.

27. The method of clause 26, wherein the lithography process response parameter include one or more of: critical dimension (CD) error, overlay error, sidewall angle change, and best focus offset.

28. The method of clause 18, the illumination source pupil characteristics are controlled by one or more of: tuning the illumination source intensity, tuning the illumination source wavelength, controlling beam pointing, and tuning the illumination source polarization.

29. The method of clause 18, wherein projection optics characteristics are adjusted to ensure stability of a point-source transmission cross-coefficient (TCC) function that is used to define the first reference performance of an illumination source.

30. The method of clause 18, wherein prior to step (a), a plurality of patterns are designed or obtained, wherein a first subset of the plurality of patterns corresponds to the variation of a first lithography process parameter, and a second subset of the plurality of patterns corresponds to the variation of a second lithography process parameter.

31. The method of clause 30, wherein the patterns comprise test patterns on a test reticle, test patterns on a target reticle, or target patterns on a target reticle.

32. The method of clause 31, wherein test patterns on a target reticle are located on one or more of the following locations: scribe lines, one or more edges of a design layout, and unutilized real estate on the design layout adjacent to or interspersed with target patterns.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modification.

What is claimed is:

1. A method of controlling stability in a lithography process, the method comprising:

(a) defining baseline performances of a lithography apparatus for use in the lithography process in a lithography model, wherein a first sub-model of the lithography model defining a first baseline performance is obtained under a first illumination condition, and a second sub-model of the lithography model defining a second baseline performance is obtained under a second illumination condition, the lithography model comprising one or more illumination source pupil characteristics and one or more lithography process response parameters;

(b) monitoring illumination stability of the lithography apparatus under the first illumination condition by measuring a first temporal drift data of the one or more illumination source pupil characteristics and using the first measured temporal drift data to maintain the one or more illumination source pupil characteristics within or substantially close to the first baseline performance; and (c) monitoring lithography process response stability under the second illumination condition by measuring a second temporal drift data of the one or more lithography process response parameters and using the second measured temporal drift data to maintain the lithography process response within or substantially close to the second baseline performance.

2. The method of claim 1, wherein the first illumination condition comprises a standard illumination condition or a custom illumination condition.

3. The method of claim 1, wherein the second illumination condition comprises a standard illumination condition, or a custom illumination condition.

4. The method of claim 2, wherein the standard illumination condition comprises one or more standard illumination modes, and the custom illumination condition comprises one or more custom illumination modes.

5. The method of claim 1, wherein step (b) is performed using direct measurement of the one or more illumination source pupil characteristics.

6. The method of claim 1, wherein step (c) is performed using one or both of a wafer metrology technique, and a lithography apparatus characteristics measurement technique.

7. The method of claim 1, wherein steps (b) and (c) include adjusting settings of the lithography apparatus used to perform the lithography process.

8. The method of claim 7, wherein the settings of the lithography apparatus include one or more selected from: an illumination source characteristic, a projection optics characteristic, a reticle characteristic, or a wafer characteristic.

9. The method of claim 7, wherein in step (c), the one or more lithography process response parameters comprise a parameter indicative of a response of the lithography process to variations of one or more settings of the lithography apparatus.

10. The method of claim 9, wherein the one or more lithography process response parameters include one or more selected from: critical dimension (CD) error, overlay error, sidewall angle change, or best focus offset.

11. The method of claim 1, wherein the one or more illumination source pupil characteristics are controlled by one or more selected from: tuning the illumination source intensity, tuning the illumination source wavelength, controlling beam pointing, or tuning the illumination source polarization.

12. The method of claim 1, wherein projection optics characteristics are adjusted to ensure stability of a point-source transmission cross-coefficient (TCC) function that is used to define the first baseline performance of an illumination source.

13. The method of claim 1, wherein prior to step (a), a plurality of patterns are designed or obtained, wherein a first subset of the plurality of patterns corresponds to the variation of a first lithography process parameter, and a second subset of the plurality of patterns corresponds to the variation of a second lithography process parameter.

14. The method of claim 13, wherein the patterns comprise test patterns on a test reticle, test patterns on a target reticle, or target patterns on a target reticle.

15. The method of claim 14, wherein test patterns on a target reticle are located on one or more selected from: scribe lines, one or more edges of a design layout, or unutilized real estate on the design layout adjacent to or interspersed with target patterns.

16. The method of claim 1, wherein the lithography model for the baseline performance is derived by matching with or adapting to an existing reference model.

17. A method of reducing temporal drift of lithography process parameters to maintain performance stability in a lithography process, the method comprising:
(a) defining baseline performances for the lithography process in a lithography model, wherein a first sub-model of the lithography model defining a first baseline performance is obtained under a first optical condition, and a second sub-model of the lithography model defining a second baseline performance is obtained under a second optical condition;
(b) measuring a first temporal drift data of a first lithography process parameter with respect to the first baseline performance under the first optical condition;
(c) measuring a second temporal drift data of a second lithography process parameter with respect to the second baseline performance under the second optical condition; and
(d) using inter-relationship of the first and the second sub-models, and the measured first and the second temporal drift data to determine required adjustments in the first and the second lithography process parameters to maintain the lithography process within or substantially close to the defined baseline performances, wherein the inter-relationship of the first and the second sub-models comprises a mathematical function that relates a lithography process response change with a change in the optical condition in both the first and the second sub-models.

18. The method of claim 17, wherein the first optical condition comprises a standard optical condition, or a custom optical condition.

19. A method of controlling stability in a current lithography process by matching the current lithography process with a reference lithography process, the method comprising:
(a) defining reference performances for the reference lithography process in a lithography model, wherein a first sub-model of the lithography model defining a first reference performance is obtained under a first illumination condition, and a second sub-model of the lithography model defining a second reference performance is obtained under a second illumination condition, the lithography model comprising one or more illumination source pupil characteristics and one or more lithography process response parameters;
(b) monitoring illumination stability in the current lithography process under the first illumination condition by measuring a first temporal drift data of the one or more illumination source pupil characteristics and using the first measured temporal drift data to maintain the current one or more illumination source pupil characteristics within or substantially close to the first reference performance; and
(c) monitoring lithography process response stability in the current lithography process under the second illumination condition by measuring a second temporal drift data of the one or more lithography process response parameters and using the second measured temporal drift data to maintain the current lithography process response within or substantially close to the second reference performance.

20. The method of claim 19, wherein the first illumination condition comprises a standard illumination condition, or a custom illumination condition.

21. The method of claim 1, wherein measuring in step (c) includes exposing a wafer using the lithography process and the second illumination condition, and wherein the second temporal drift data is obtained using measurements of the exposed wafer.

22. The method of claim 1, wherein using the first and second measured temporal drift data includes calibrating the lithography model based on the first and second measured temporal drift data and deriving adjustments to be made to the lithography process based on the calibrated lithography model.

23. The method of claim 17, wherein using the first and second measured temporal drift data includes calibrating the lithography model based on the first and second measured temporal drift data and deriving the adjustments to be made to the lithography first and second process parameters based on the calibrated lithography model.

24. The method of claim 19, wherein measuring in step (c) includes exposing a wafer using the current lithography process and the second illumination condition, and wherein the second temporal drift data is obtained using measurements of the exposed wafer.

25. The method of claim 19, wherein using the first and second measured temporal drift data includes calibrating the lithography model based on the first and second measured temporal drift data and deriving adjustments to be made to the current lithography process based on the calibrated lithography model.

* * * * *